United States Patent [19]

Tran

[11] Patent Number: 5,001,362

[45] Date of Patent: Mar. 19, 1991

[54] BICMOS REFERENCE NETWORK

[75] Inventor: Hiep V. Tran, Carrollton, Tex.

[73] Assignee: Texas Instruments Incorporated, Dallas, Tex.

[21] Appl. No.: 310,800

[22] Filed: Feb. 14, 1989

[51] Int. Cl.[5] ...................... H03K 17/16; H03K 5/153

[52] U.S. Cl. ............................. 307/296.4; 307/296.6; 307/296.7; 307/443; 307/446; 307/490; 307/362; 307/570

[58] Field of Search ............... 307/261, 490, 362, 443, 307/446, 296.4-296.7, 570

[56] References Cited

U.S. PATENT DOCUMENTS 4,618,816 10/1986 Monticelli ........................ 307/296.7
4,621,206 11/1986 Hashimoto .......................... 307/362
4,780,624 10/1988 Nicollini et al. .................... 307/446
4,798,981 1/1989 Tsugaru et al. ..................... 307/446
4,810,902 3/1989 Storti et al. ......................... 307/446

*Primary Examiner*—Stanley D. Miller
*Assistant Examiner*—Margaret Wambach
*Attorney, Agent, or Firm*—James T. Comfort; Melvin Sharp; Stanton C. Braden

[57] ABSTRACT

A BiCMOS current source reference network which eliminates the impact of d.c. power supply voltage drops on the operation of ECL circuits is described. This invention is essential for implementing ECL design techniques in VLSI BiCMOS circuits. Using the current source network, reference voltages are generated locally so that the ECL voltage references are correctly referenced to the local power supply potentials. A power supply insensitive band-gap reference generator is used to generate precision on-chip voltage references and current sources. The band-gap circuit uses both MOS and bipolar transistors and is much simpler than a similar using bipolar-only circuitry.

4 Claims, 11 Drawing Sheets

BICMOS REFERENCE NETWORK

FIELD OF THE INVENTION

This invention is in the field of BiCMOS integrated circuits.

BACKGROUND OF THE INVENTION

Until now, the signal voltage swing and signal margin of emitter coupled logic, ECL, has been controlled by a single on-chip voltage reference circuit. The disadvantage of this conventional approach is that voltages are only accurately referenced to power supply levels physically near the reference circuits. The voltage drops associated with power supply currents cause the actual power supply levels to vary considerably across the semiconductor chip and invalidate the reference voltages. This has been found to be particularly true when ECL logic is used in the design of VLSI BiCMOS circuits.

FIG. 1 illustrates a standard ECL gate. It comprises differential pair 2 (which includes N-type bipolar transistors 01 and 02) and source follower stage 4. N-type bipolar transistors 04 and 05 are connected together so as to form the output of the gate. The gate's power dissipation is controlled by the VREF1 signal (VREF1 being a voltage). If transistor 03 is kept out of saturation during its operation, then current Ics (through resistor R connected to the emitter of transistor 03) is equal to (VREF1−VBE)/R. The VREF1 voltage controls the output voltage swing of the gate. It can be seen that the difference between the high and the low output levels of this gate is Ics*R and that this is a voltage drop across the pull-up resistor of the differential pair. The input trip point of this gate is set up by a VREF2 signal voltage between power supply voltage VCC and the voltage at the base of transistor 02. If the input of this ECL gate (node IN) is driven by the signal from the output of another ECL gate similar to this gate, then VREF2 has to be set at the midpoint of this output voltage swing to achieve maximum signal margin and performance. If VREF1 and VREF2 are kept at constant levels, then voltage drops on the VCC and VEE power lines will invalidate both voltage references.

FIGS. 2A and B illustrate the physical layout of VCC and VEE power supply pads on a chip and an associated graph. In this figure, the pads are near each other. The band-gap reference circuit which produces voltages VREF1 and VREF2 is placed near the power pads and blocks of ECL circuits are placed at increasing distances away from the power pads. Resistances in the power lines are shown modeled as resistors R.

The graph in FIG. 2B illustrates selected voltages vs. distance. The X axis gives the distance from the power pads of the corresponding ECL circuit shown above it and the Y axis shows the voltage of major signals in the ECL gates. The voltage drops along the VCC and VEE power lines are shown here in the graph as the dark regions. The ECL circuit at the end of the power lines suffers the most voltage drop. Because VREF1 and VREF2 are referenced to the power pads, they are at a constant level regardless of how far they are away from the pads. However, the current reproduced by VREF1 at the local ECL circuit is not constant. This will effect the low output voltage of ECL gates along the power lines. The high output of the ECL gate is also lowered by voltage drops in the VCC line. These effects severely degrade the signal margin. If the voltage drops in the power line are greater than one half of output voltage swing, this will probably result in complete chip operation failure.

FIGS. 3A and B illustrate an example of a SRAM which is designed to fit in a standard JDEC package. FIG. 3B also illustrates a corresponding graph of selected voltages vs. distance, a similar type of plot to that illustrated in FIG. 2B. It has the power pads at opposite ends of the chip. The effects of the power line voltage drops are almost the same except that now the signal voltage swings are larger and may cause catastrophic failure due to the forward biasing of the next ECL stages which are receiving output signals.

FIGS. 4A and B illustrate multiple (two) band-gap reference circuits in a configuration similar to that shown in FIGS. 2 and 3A. FIG. 4B additionally illustrates a corresponding graph of selected voltages vs. distance. Two band-gap circuits are placed at each end of the package. Large layout areas are required for this scheme. Additionally, the critical location of these reference circuits reduce the effectiveness of the scheme. The ECL circuits farthest from the reference circuits still suffer signal degredations and still depend on how much power line voltages have dropped at their location. A similar problem arises in other circuits involving current mode logic, CML, gates. FIG. 5 illustrates a standard CML gate comprising differential pair 2 comprising transistors 01 and 02 connected to transistor 03. It can be easily seen that variations in either the value of VREF1 or VEE will cause variations in the signal swing as well as the current drawn by this gate. Furthermore, variations in VREF2 or VCC can adversely impact the noise margin required to make this circuit element function reliably. The effect of the reference voltage on current of a BiCMOS/ECL circuit block is shown in FIG. 6, which illustrates the variation in current IEE with respect to reference voltage variation.

OBJECTS OF THE INVENTION

It is an object of the invention to provide a new and improved reference network.

It is another object of the invention to provide a BiCMOS reference network.

These and other objects of the invention, together with the features and advantages thereof, will become apparent from the following detailed specification when read together with the accompanying drawings in which applicable reference numerals have been carried forward.

SUMMARY OF THE INVENTION

The foregoing objects of the invention are accomplished by establishing reference voltages which are defined with respect to local power supply levels. The local supply levels are established through the use of a network of reference current sources. The reference current sources can be routed across the chip without having to give special consideration to power supply fluctuations. The current sources serve as inputs to analog drivers which generate the reference voltages with the respect to the local power supply levels. The semiconductor chip on which the invention is embodied uses a global band-gap reference circuit that operates in conjunction with current source feed back implemented with a PMOS current mirror. BiCMOS Op Amps are used as the analog drivers. The analog drivers convert band-gap reference outputs to the required levels and provide low impedance sources to ECL circuits for the chip. By converting the global band-gap voltage (from the global band-gap reference circuit) to current references and regenerating a voltage reference at a local ECL circuit block, the effects of voltage drop differences between the power supply lines of the global band-gap circuit and the local ECL blocks are substantially eliminated.

ADVANTAGES OF THE INVENTION

The invention has advantages which include the following:

1. A concise ECL signal voltage swing within an ECL circuit block for maximum speed.
2. Tracked reference for single ended ECL signals to achieve maximum signal margin.
3. Precise reference levels for off-chip interfaces to provide high performance I/O's.
4. The effect of the power supply lines voltage drop are minimized and contained inside circuit blocks.
5. Improved chip operation margin is achieved by preventing the feed back noise of switching gates from propagating back to the band-gap reference circuit.
6. Low impedance voltage reference sources provide high current handling capability which in turn serve to improve the bipolar transistor process margin.

DETAILED DESCRIPTION OF THE INVENTION

Figure 1:
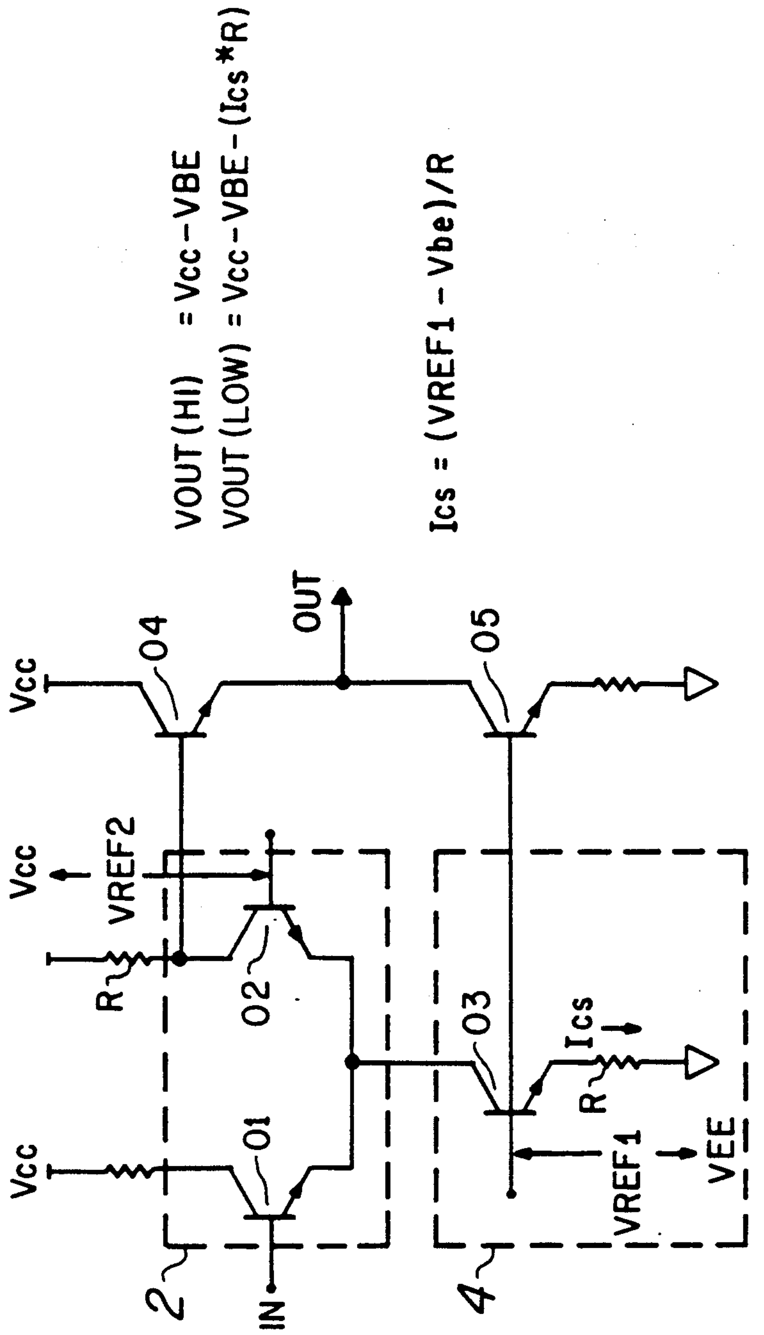
FIG. 1 illustrates a standard ECL gate.
Figure 2A:
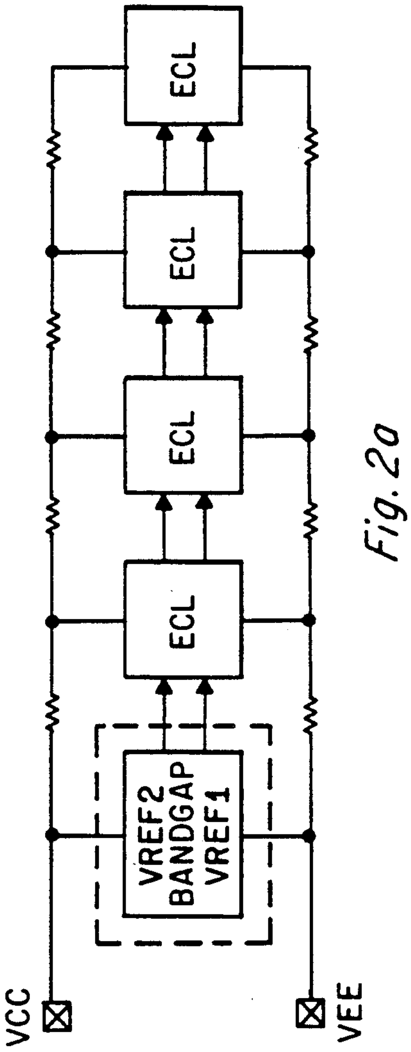
FIGS. 2A and B illustrate the physical layout of VCC and VEE power supply pads on a semiconductor chip and an associated graph.
Figure 2B:
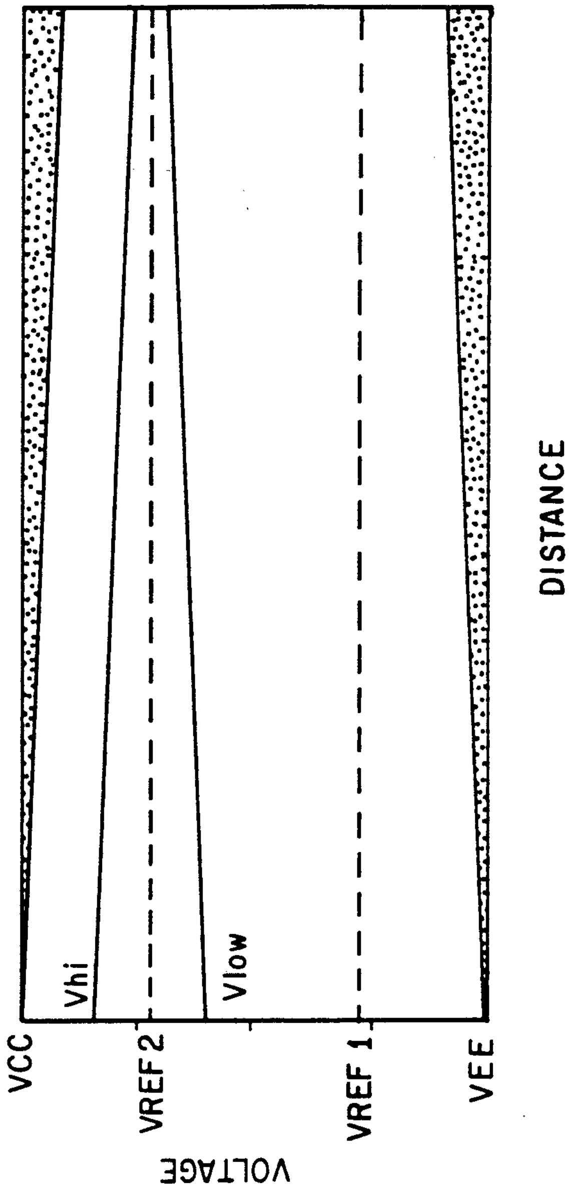
Figure 3A:
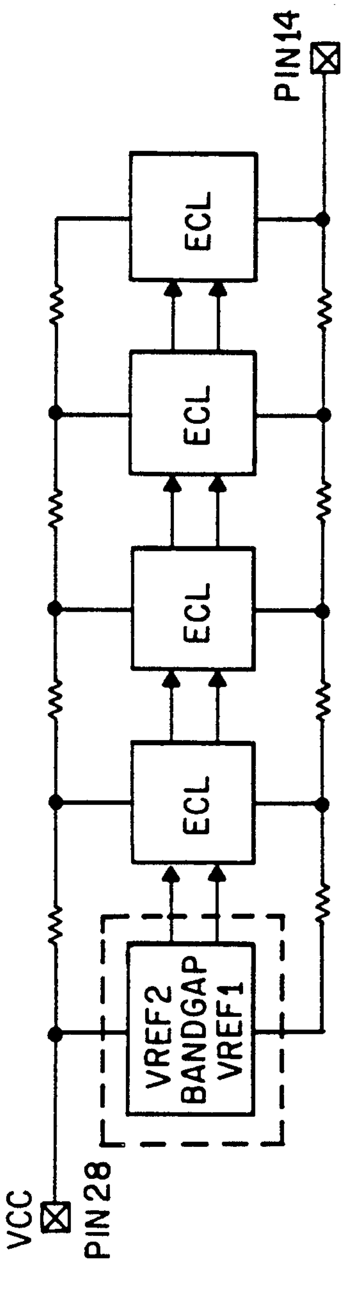
FIGS. 3A and B illustrate an example of a SRAM which is designed to fit in a standard JDEC package.
Figure 3B:
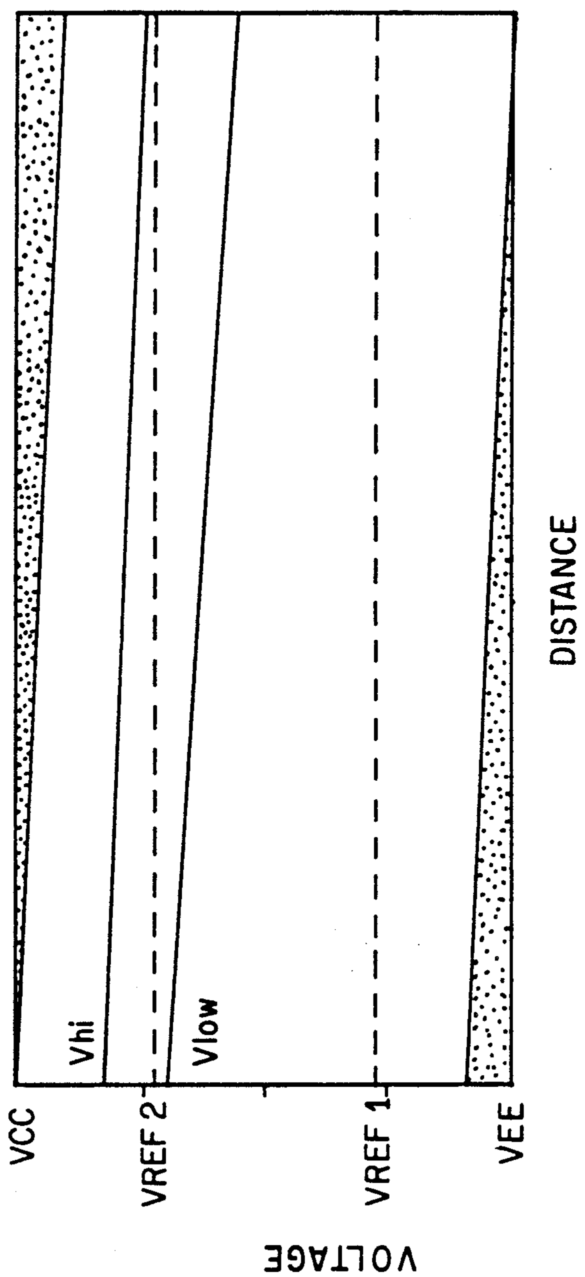
Figure 4A:
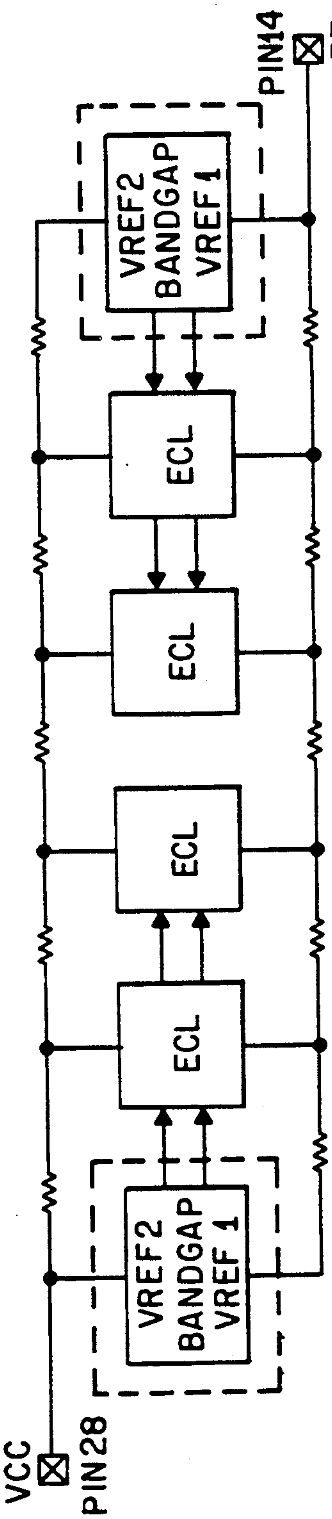
FIGS. 4A and B illustrate multiple band-gap reference circuits in a configuration similar to that shown in FIGS. 2 and 3.
Figure 4B:
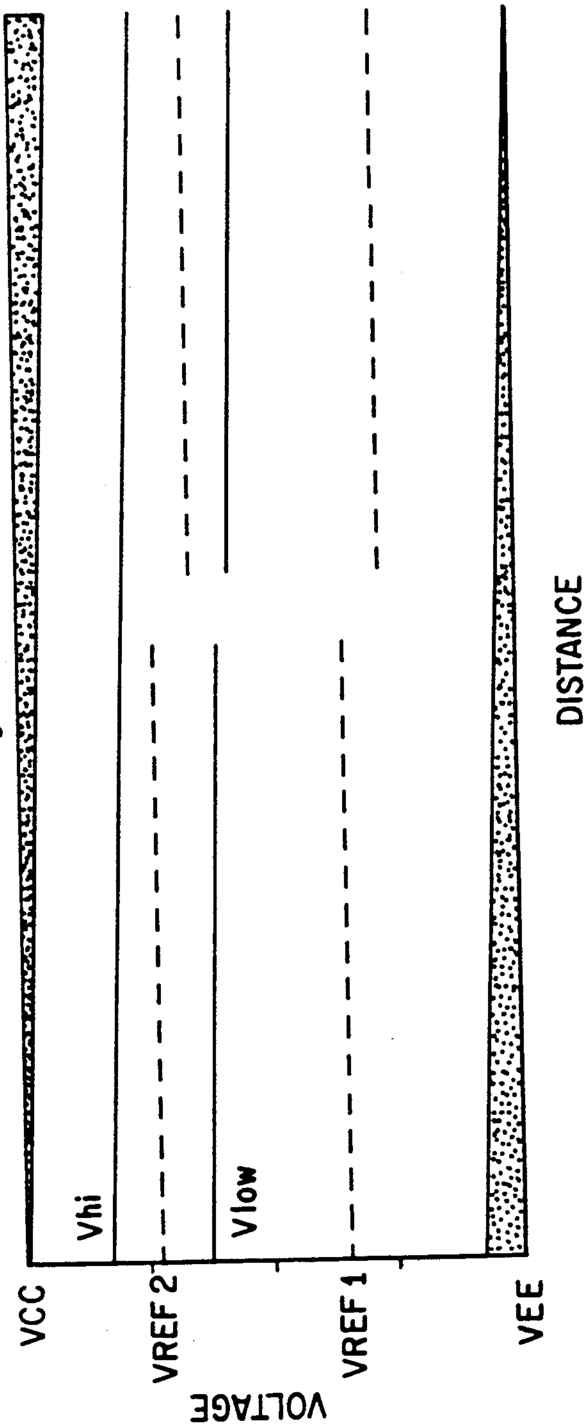
Figure 5:
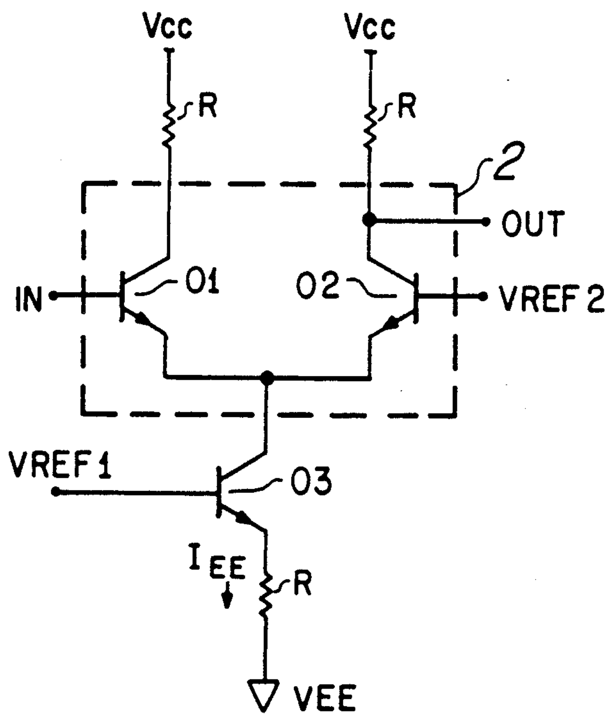
FIG. 5 illustrates a standard CML gate.
Figure 6:
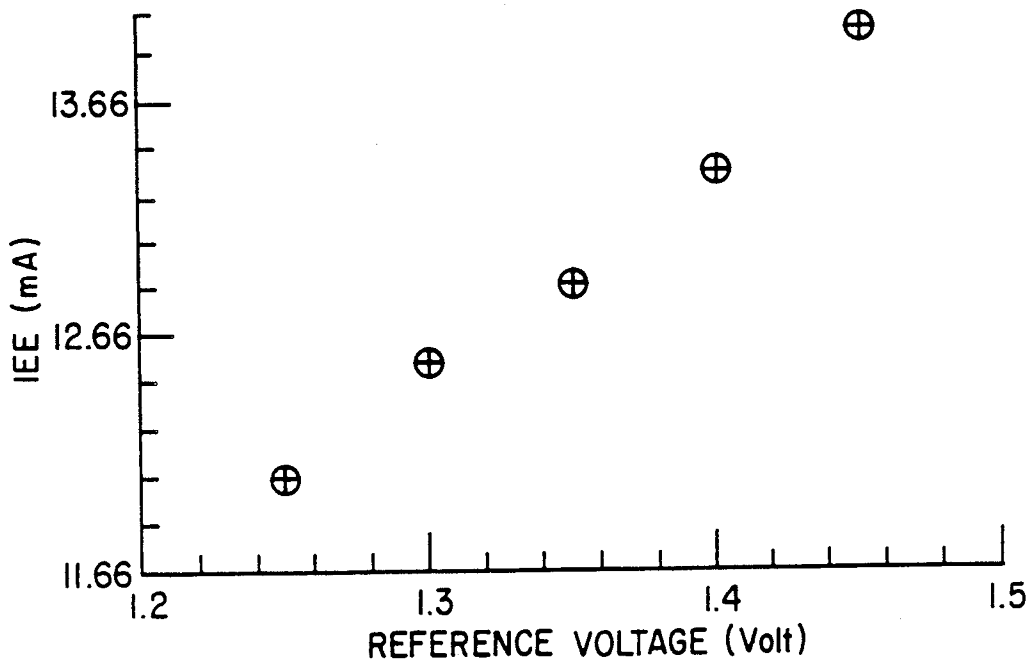
FIG. 6 illustrates the variation in current IEE with respect to reference voltage variation.
Figure 7A:
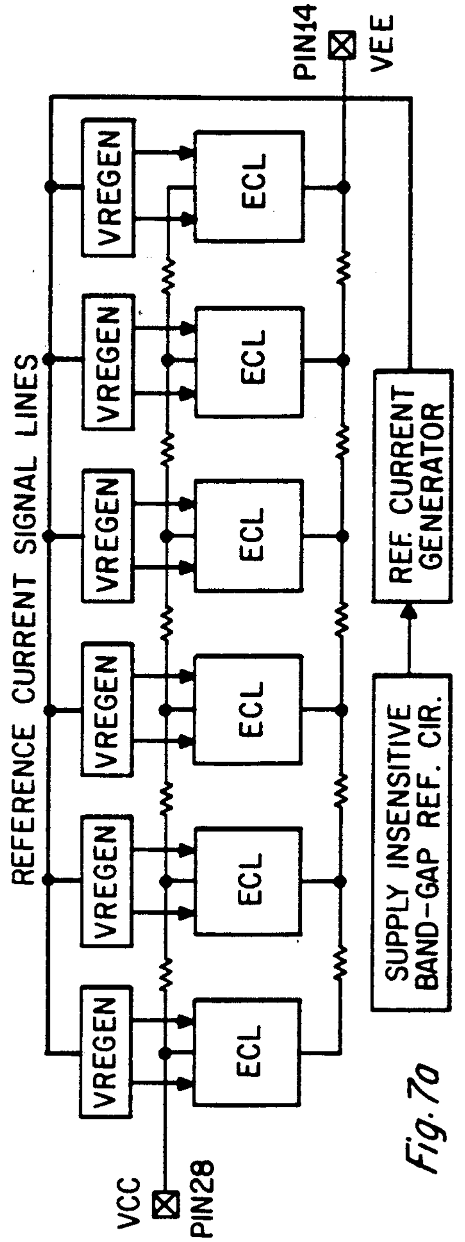
FIGS. 7A and B illustrate a preferred embodiment of the invention together with a graph of selected voltages vs. chip distance.
Figure 7B:
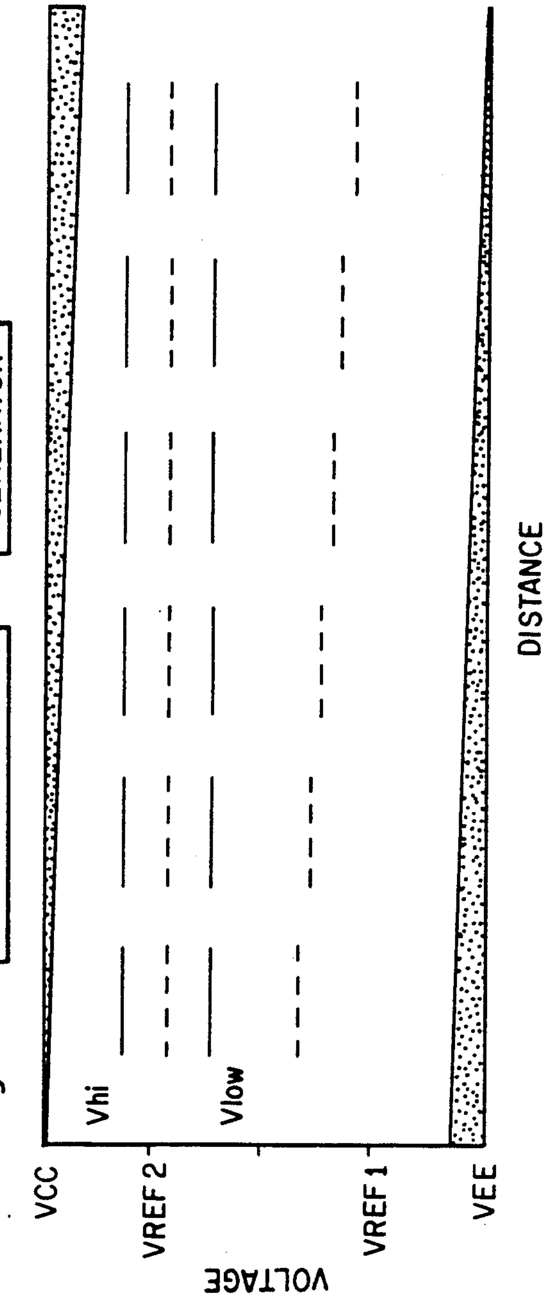

FIG. 7 illustrated a preferred embodiment of the invention together with a graph of selected voltages vs. chip distance. Each ECL circuit block has its own reference circuit VREGEN. The ECL circuits receive not the voltages, but the current references from a reference current generator. A reference current generator converts the voltage from a band-gap reference circuit to currents before sending the signal to remote locations such as ECL gates distributed on a chip. At these locations, the reference current will be converted to voltage to provide a correct reference voltage for a local circuit such as a local ECL gate. The invention thus substantially eliminates the previously discussed problem of voltage drop in power supply lines leading to each ECL block. As shown in the graph, VREF1 and VREF2 are correctly referenced to the local power supply levels. Maximum signal margin is restored because the I/0 signals inside each ECL block are now at correct levels. Notice that the signals are only offset from block to block.

Several circuit techniques can now be used to resolve problems of global signal communication between ECL circuit blocks. These techniques include the following: differential signal usage; single ended signals with trip point reference from the sender; level shifter circuits; and minimization of VCC power line voltage drops. To keep the VCC drop at a minimum, more area on the VCC line in a layout can be used. A wider VCC power line reduces resistance. Prior to the invention, both VCC and VEE lines had to be widened in order to minimize voltage drops. Depending upon the individual circuit requirements, one of these techniques, or all, can be used. The differential signals for the communication between ECL blocks provide the best signal margin but require the most layout area and also restrict the logic operation which can be performed with the available signals. Single ended signals can be used. However, the trip point reference level should be sent to the receiving circuit from the sender to improve the signal margin. Level shifter circuits at both sender or receiver will provide an effective communication but it will add some complicated circuitry. However, the simplest technique improves the ground line. Reducing the voltage drops of the VCC line (widening the VCC power line) in the ECL circuit will effectively improve the signal margin by the same amount.

Figure 8A:
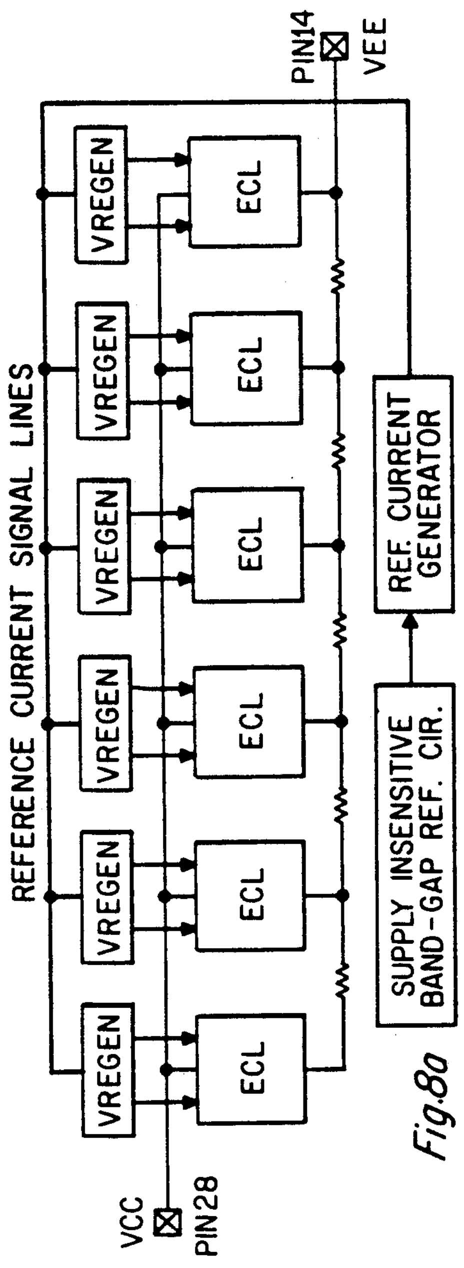
FIGS. 8A and B illustrate an embodiment of the invention similar to that shown in FIG. 7A. The VCC power line, however, has been minimized through allocation of more area for it in a circuit layout.
Figure 8B:
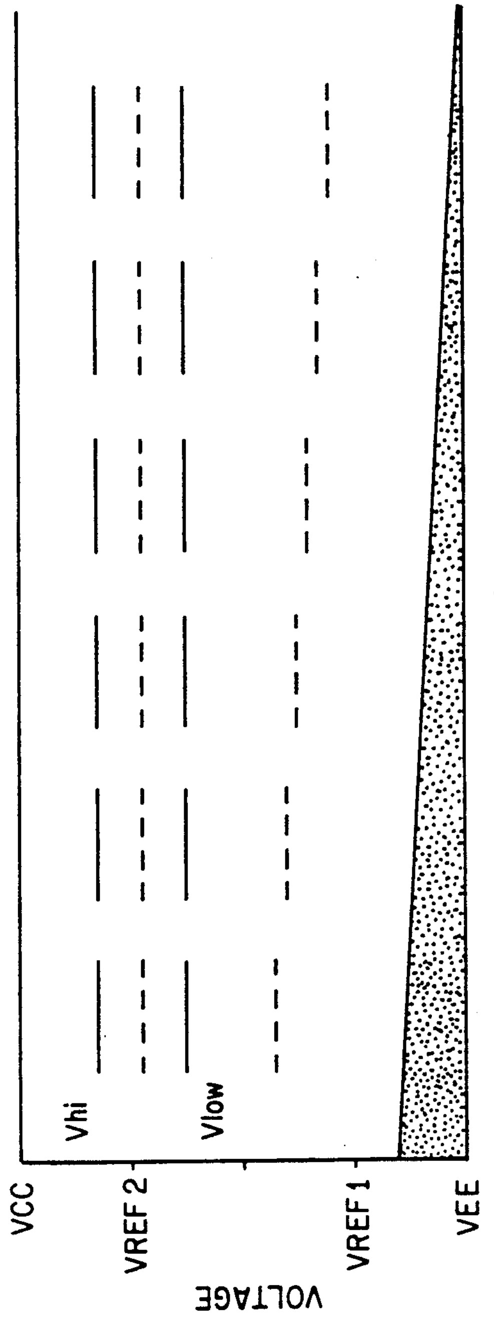

FIG. 8 illustrates an embodiment of the invention similar to that shown in FIG. 7. However, the VCC power line voltage drop has been minimized through allocation of more area for it in a circuit layout. As shown in the graph, the invention allows the circuit to tolerate the voltage drops on the VEE line much more than the standard reference techniques. If the VCC power line voltage is as shown, then all ECL I/0 (input-/output) signals from all blocks will be aligned. The invention makes the physical location of the band-gap and the current generator with respect to power pads and circuit blocks noncritical.

Figure 9:
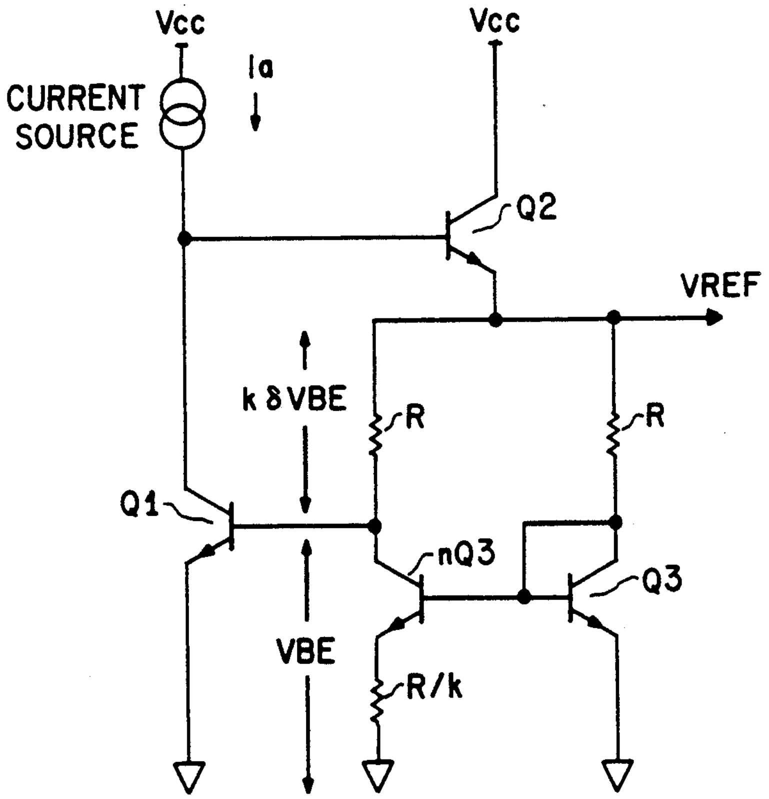
FIG. 9 illustrates a standard band-gap reference circuit.

A key component of the network of the invention is a BiCMOS band-gap circuit which is insensitive to the power supply variations. This band-gap circuit was disclosed in Ser. No. 07/161,694, filed Feb. 29, 1988. In order to fully explain this circuit, reference shall be made to FIG. 9, which illustrates a standard band-gap reference circuit. A current source is connected to the base of N-type bipolar transistor Q2 and the collector of N-type bipolar transistor Q1. The base of Q1 is connected to the collector of n-type transistor nQ3 and the bases of transistor nQ3 and transistor Q3 are connected together. Resistors are illustrated with their relative values displayed alongside. Voltages are displayed between arrowheads. The output of the circuit results in a reference voltage VREF. The reference output VREF is equal to the sum of VBE and k*delta VBE (k being the denominator of the resistor connected to the collector of transistor nQ3). Transistor Q1 is used as a negative feedback amplifier to keep the VREF at nearly equal to the band-gap voltage of silicon (about 1.25 volt) for maximum temperature stability. The variation of the load current Ia (from the current source) of this circuit has a direct effect on the VREF output. One of the main causes of the Ia current variation is the power supply fluctuation. The band-gap circuit of the invention keeps the current Ia as stable as possible. There are many existing circuit techniques to generate a stable current source for this purpose, but they are often unreliable, complicated and required a large layout area. For example, one of the most common design techniques is using another band-gap to generate the Ia current.

Figure 10:
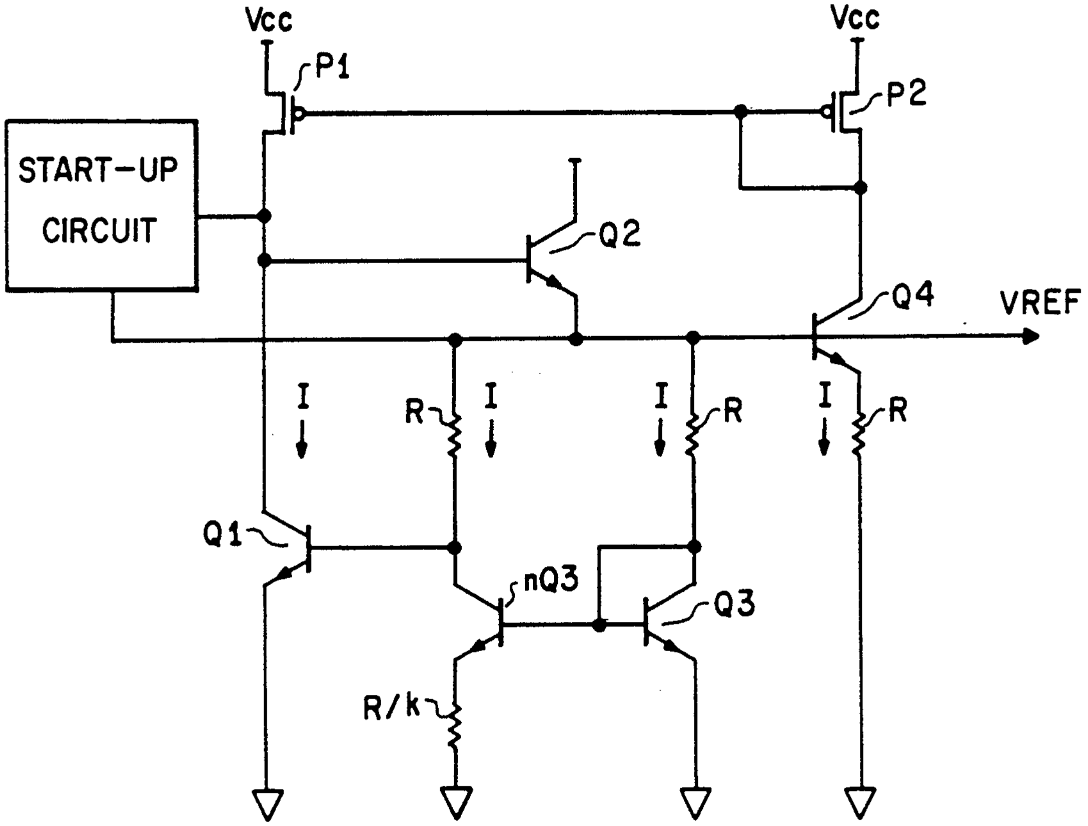
FIG. 10 illustrates the BiCMOS band-gap circuit used in the invention.

FIG. 10 illustrates the BiCMOS band-gap circuit used in the invention. Unlike standard band-gap circuits, this circuit is simple and does not require a second band-gap circuit to generate the Ia current. This circuit uses its own band-gap output to generate a load current. This is accomplished by using the P-channel MOS transistors, P1 and P2, to mirror the current I which is generated by the output voltage VREF, from transistor Q4 through resistor R, and to the load of a feed back amplifier, transistor Q1. A stable voltage output VREF will provide a steady load current and vice versa by the self-feed-back. As shown, a start-up circuit is required to keep the circuit out of zero current mode (which produces zero feed back) due to the self-feed-back. Once the reference output is at a correct level, the start-up circuit is no longer needed and should be electrically disconnected to avoid possible ill effects. Notice that the currents flowing in the branches are kept equal for maximum tracking ability.

Figure 11:
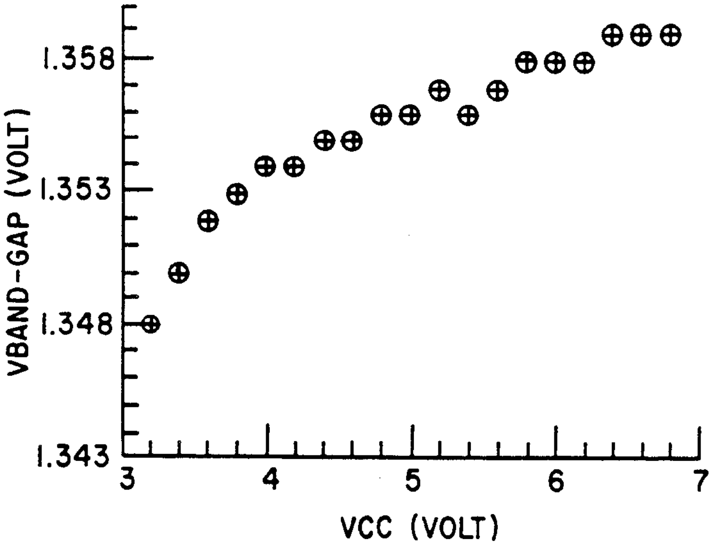
FIG. 11 shows the output of the invention's band-gap circuit versus a VCC voltage from 3 to 7 volts.

FIG. 11 shows the output of the invention's band-gap circuit versus a VCC voltage from 3 to 7 volts. Fourteen milivolts of output variation was seen across the entire range (0.35%), but the circuit operates much better in a VCC range from 4 to 7 volts. The output only varied 5 milivolts in this range (0.16%).

Figure 12:
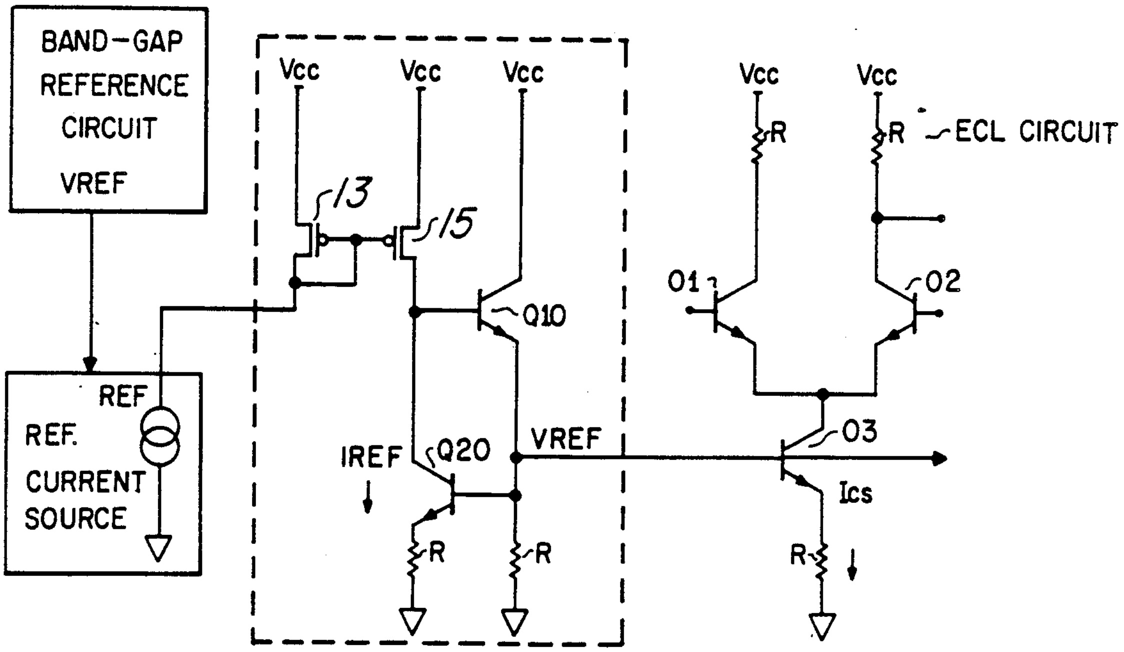
FIG. 12 illustrates the reference current to voltage conversion circuit of the invention.

FIG. 12 illustrates the reference current to voltage conversion circuit of the invention. This circuit is used at each local location of an ECL circuit block. The global band-gap voltage VREF is converted to a reference current IREF and then routed to a remote ECL circuit block. At the ECL block, the IREF current is mirrored by P-channel transistors 13 and 15 and passed through bipolar transistor Q20 and resistor R to regenerate the VREF level that corresponds to the local VEE voltage level. The output from this circuit can be directly connected to ECL circuits (as shown) or can be connected to an operational amplifier (Op Amp) to provide greater current handling capability or more flexibility to regenerate different voltage reference levels. The VREF signal is taken from the emitter of transistor Q1O which is connected to P-channel transistor 15 and bipolar transistor Q20.

Figure 13:
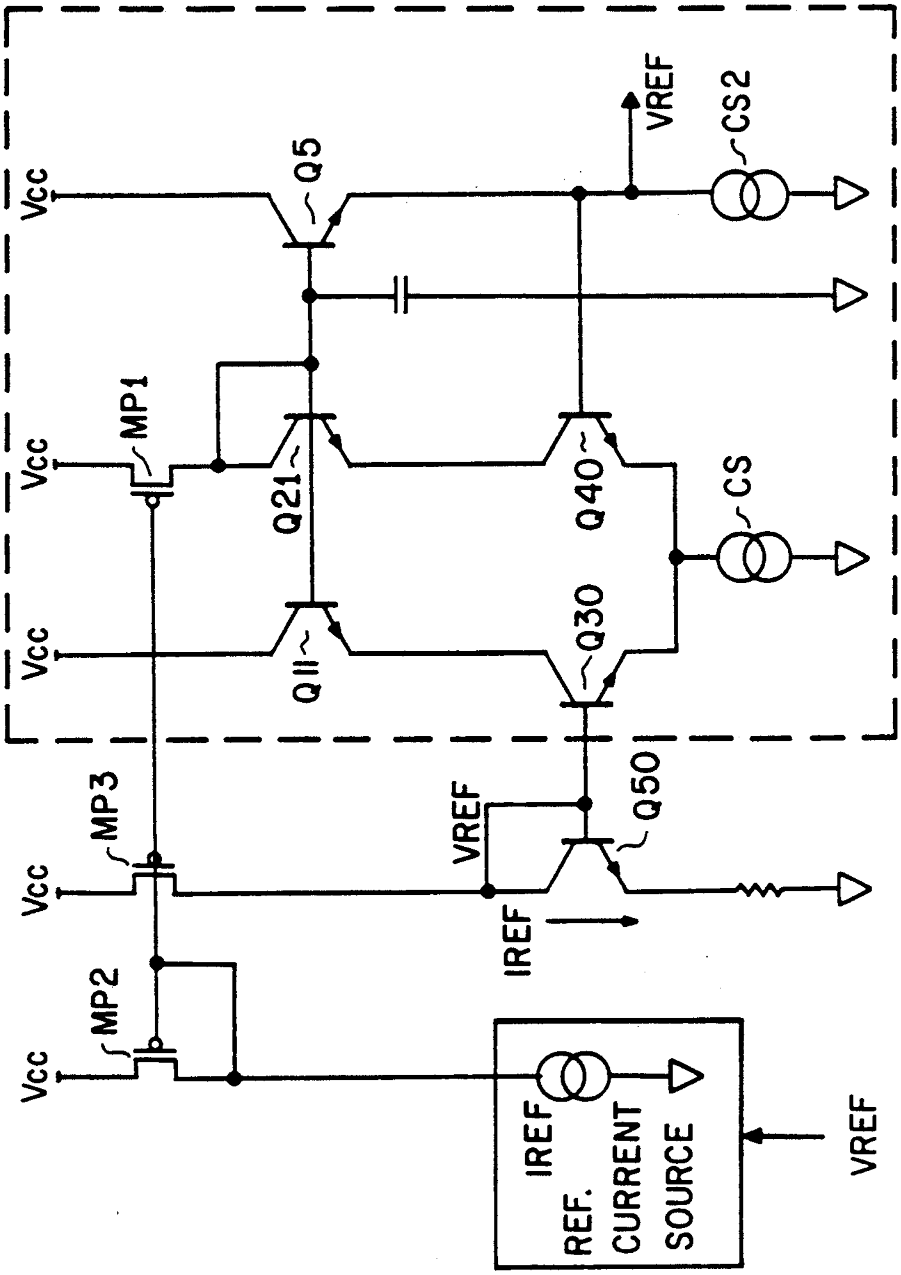
FIG. 13 illustrates an Op Amp driver circuit.

FIG. 13 illustrates the Op Amp driver circuit discussed above. The Op Amp driver is shown inside the dashed box. The Op Amp is connected in a unity gain configuration to produce at its output the same voltage level connected to its input. It uses a P-channel current source NP1 for the load to improve the gain of the differential stage comprising bipolar transistors Q30, Q40 and current source CS. The cascode transistors Q11 and Q21 are used to minimize the input offset which might be caused by the difference of the VCE voltage between transistors Q30 and Q40. The output from the Op Amp driver circuit is taken from the emitter of transistor Q5. Other circuitry for implementing the connection of the Op Amp to the rest of the scheme comprises gate connected P-channel transistors MP2 and MP3. Diode configured transistor Q50 is connected to P-channel transistor MP3 and generates a reference current IREF.

Figure 14:
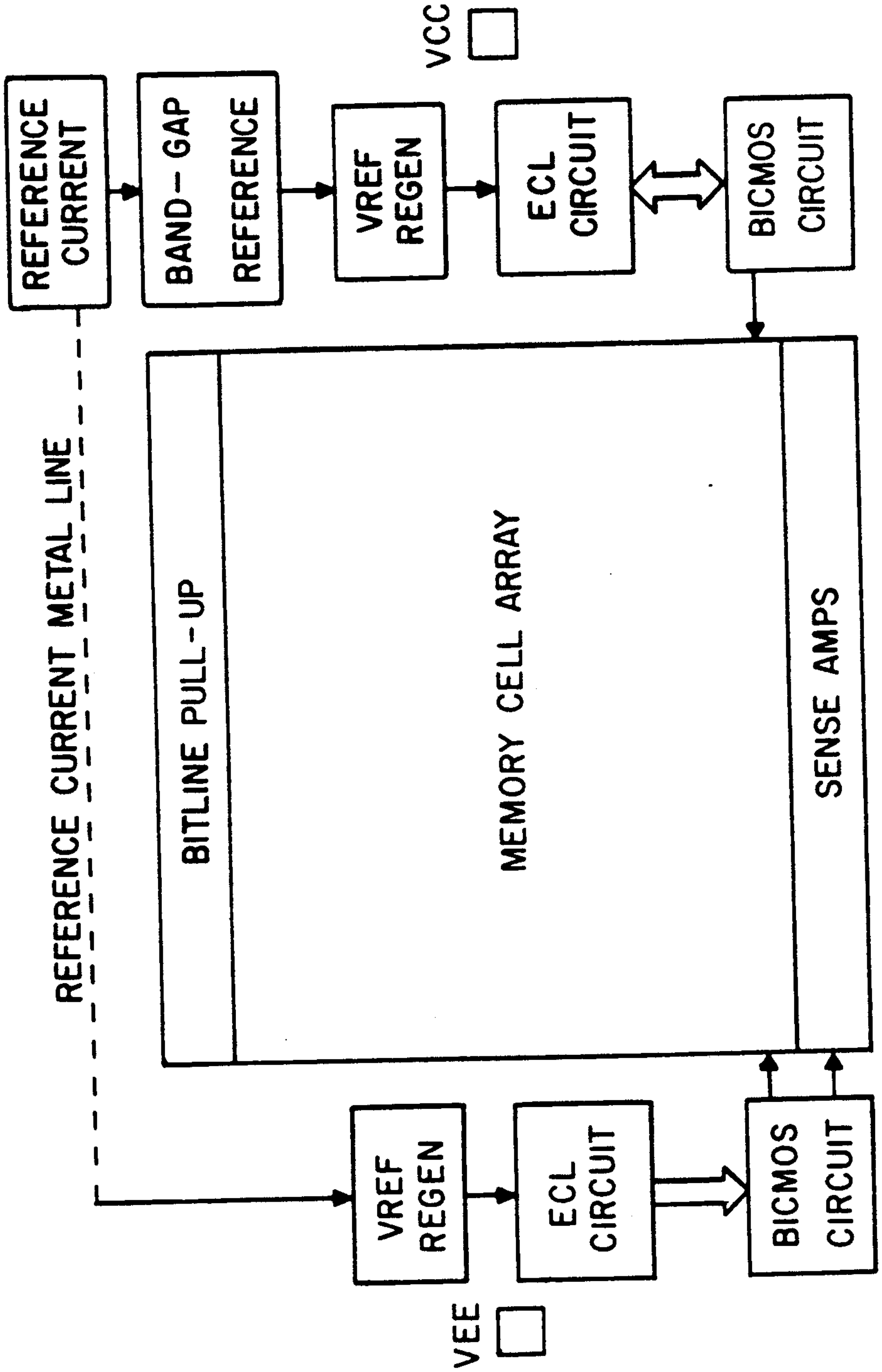
FIG. 14 illustrates a block diagram of the reference network.

An experimental prototype of the invention has been fabricated with 0.8u BiCMOS double metal process. The operating power supply is from 0 to 7 volts. Most of the layout area of the band-gap and the Op Amp are consumed by compensation capacitors used for operation stability. The output band-gap voltage was measured at 1.356 volt with the temperature coefficient of 200 ppm per degree C. This is a bit high because the nonoptimum resistor k factor in the band-gap. The open loop gain of the Op Amp was only 45 db but this is adequate for its purpose in the network. 1 of the band-gap circuit was 47 db while the rejection ratio for the Op Amp was 67 db. The network was implemented in a 1 meg BiCMOS SRAM. The block diagram of the network is shown in FIG. 14. Power supply pads are at the opposite side of the chip. The global band-gap is placed near VCC power pad. Reference current is routed to the other side of the network and regenerated at local ECL circuit locations. BiCMOS circuits are used for global communications in this SRAM. The characteristics of the foregoing network include minimized power supply drop effects, maximized ECL signal margin, and improved ECL circuit performance of a VLSI BiCMOS ECL chip.

Although the invention has been described in detail herein with reference to its preferred embodiment and certain described alternatives, it is to be understood that this description is by way of example only, and is not to be construed in a limiting sense. It is to be further understood that numerous changes in the details of the embodiments of the invention, and additional embodiments of the invention, will be apparent to and may be made by persons of ordinary skill in the art having reference to this description. For instance, other types of logic circuits may be substituted for the emitter coupled logic gates previously described. These include TTL, DTL, RTL, and CML circuits. Additionally, analog circuits may be substituted for the logic circuits. Furthermore, any circuit requiring a reference voltage may be substituted for the ECL circuit previously discussed. Although field-effect and bipolar transistors have been shown in specific instances in the drawings, bipolar transistor may substituted for field-effect transistors and vice-versa. Furthermore, P-type transistors may be substituted for n-type transistors and vice-versa. Likewise, N-channel transistors may be substituted for P-channel transistors and vice-versa. It is contemplated that all such changes and additions are within the spirit and true scope of the invention as claimed below. Accordingly, the invention is intended to be limited only by the scope of the appended claims.

I claim:

1. A reference network comprising:

a voltage reference circuit, including a current mirror coupled to a current to voltage conversion circuit, operative to produce a reference voltage, said current to voltage conversion circuit comprising an operational amplifier;

a reference current generator operatively associated with said voltage reference circuit so as to produce a reference current derived from said reference voltage;

at least one sub-circuit requiring a certain reference voltage for proper operation; and at least one voltage generation circuit operative to provide said certain reference voltage based on said reference current to said sub-circuit.

2. A reference network as recited in claim 1, wherein said operational amplifier is a BiCMOS operational amplifier.

3. A reference network as recited in claim 1, wherein said operational amplifier comprises a differential amplifier and a field effect current source connected to said differential amplifier; said current source in operation serving as a load for said differential amplifier.

4. A reference network as recited in claim 3 wherein said field-effect current source is operative to mirror said reference current from said reference current generator.

* * * * *